United States Patent
Yeh

(10) Patent No.: US 9,171,995 B2
(45) Date of Patent: Oct. 27, 2015

(54) FLIP CHIP TYPE LIGHT EMITTING DIODE AND MANUFACTURING METHOD THEREOF

(75) Inventor: Robert Yeh, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 13/482,485

(22) Filed: May 29, 2012

(65) Prior Publication Data

US 2012/0305967 A1 Dec. 6, 2012

Related U.S. Application Data

(60) Provisional application No. 61/491,307, filed on May 30, 2011, provisional application No. 61/527,586, filed on Aug. 25, 2011.

(51) Int. Cl.
*H01L 33/00* (2010.01)
*H01L 33/38* (2010.01)
*H01L 33/62* (2010.01)

(52) U.S. Cl.
CPC .......... *H01L 33/0079* (2013.01); *H01L 33/382* (2013.01); *H01L 33/62* (2013.01); *H01L 2924/0002* (2013.01); *H01L 2933/0016* (2013.01); *H01L 2933/0033* (2013.01); *H01L 2933/0066* (2013.01)

(58) Field of Classification Search
CPC .................................................... H01L 33/382
USPC ........................... 257/79, 81, 98–100; 438/42
See application file for complete search history.

(56) References Cited

U.S. PATENT DOCUMENTS

| | | | |
|---|---|---|---|
| 7,863,626 B2 * | 1/2011 | Shum | 257/81 |
| 8,129,743 B2 * | 3/2012 | Suehiro et al. | 257/100 |
| 2002/0117681 A1 | 8/2002 | Weeks et al. | |
| 2007/0096130 A1 * | 5/2007 | Schiaffino et al. | 257/98 |
| 2008/0142817 A1 | 6/2008 | Ibbetson et al. | |
| 2009/0057690 A1 * | 3/2009 | Chakraborty | 257/88 |
| 2009/0173956 A1 | 7/2009 | Aldaz et al. | |
| 2010/0276706 A1 | 11/2010 | Herrmann | |
| 2011/0012164 A1 * | 1/2011 | Kim | 257/99 |
| 2011/0227111 A1 * | 9/2011 | Choi et al. | 257/98 |
| 2012/0018763 A1 * | 1/2012 | Engl et al. | 257/99 |
| 2012/0086023 A1 * | 4/2012 | Veerasamy et al. | 257/88 |

FOREIGN PATENT DOCUMENTS

| | | |
|---|---|---|
| CN | 101517758 | 8/2009 |
| CN | 101971344 | 2/2011 |
| CN | 102024890 | 4/2011 |

(Continued)

*Primary Examiner* — Cheung Lee
*Assistant Examiner* — Frederick B Hargrove
(74) *Attorney, Agent, or Firm* — Han IP Corporation

(57) ABSTRACT

The present disclosure provides a flip chip type light emitting diode which comprises a substrate and a light emitting diode chip. The substrate comprises a body, a plurality of third pads, a fourth pad, a first electrode, a second electrode, a plurality of first vias, and a second via. The body has a first surface and a second surface opposite to the first surface. The third pads and the fourth pad are disposed on the first surface of the body. The first electrode and the second electrode are disposed on the second surface of the body. The first vias traverse through the body and are each electrically coupled to a respective one of the third pads and the first electrode. The second via traverses through the body and is electrically coupled to the fourth pad and the second electrode.

19 Claims, 9 Drawing Sheets

(56) References Cited

FOREIGN PATENT DOCUMENTS

| | | |
|---|---|---|
| DE | WO2010124915 | 11/2010 |
| DE | WO2011003907 A1 | 1/2011 |
| JP | 2001-217467 | 8/2001 |
| JP | 2002-368263 | 12/2002 |
| JP | 2005-093970 | 4/2005 |
| JP | 2005-322722 | 11/2005 |
| JP | 2007-180204 | 7/2007 |
| JP | 2007-184425 | 7/2007 |
| JP | 2008-300501 | 12/2008 |
| JP | 2009-134965 | 6/2009 |
| JP | 2010-514189 | 4/2010 |
| JP | 4454689 | 4/2010 |
| JP | 2010-103186 | 5/2010 |
| JP | 2010-525585 | 7/2010 |
| JP | 4657374 | 3/2011 |
| JP | 2012-507847 | 3/2012 |
| JP | 2013-511142 | 3/2013 |
| KR | 1020090010623 | 1/2009 |
| KR | 10-2010-0099286 | 9/2010 |
| KR | 10-2011-0008550 | 1/2011 |
| WO | WO2009007974 | 6/2009 |
| WO | WO2010052621 | 5/2010 |
| WO | WO 2011/058094 A1 | 5/2011 |

\* cited by examiner

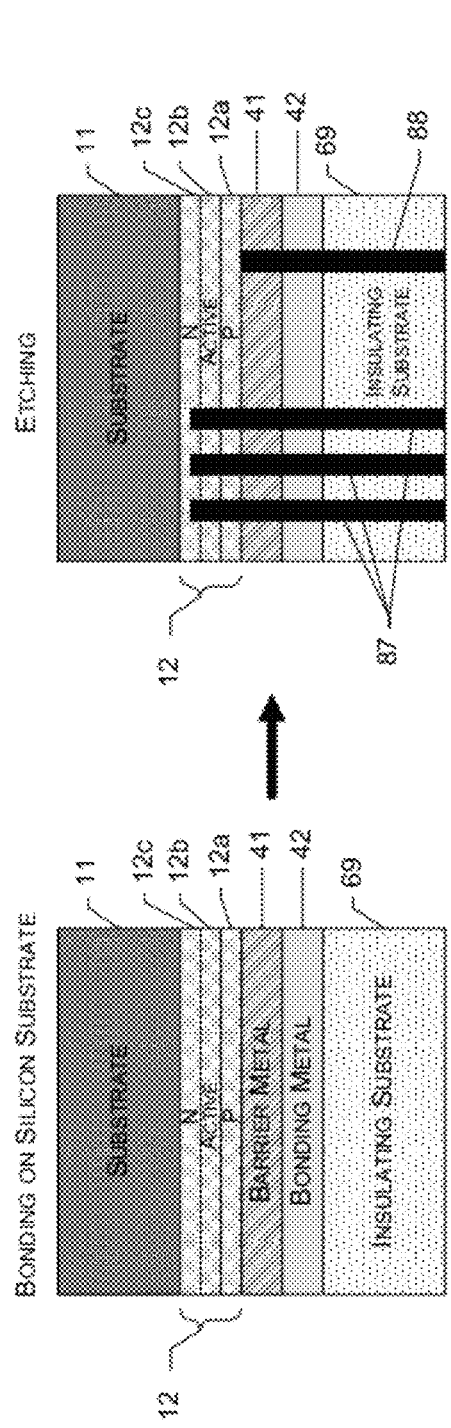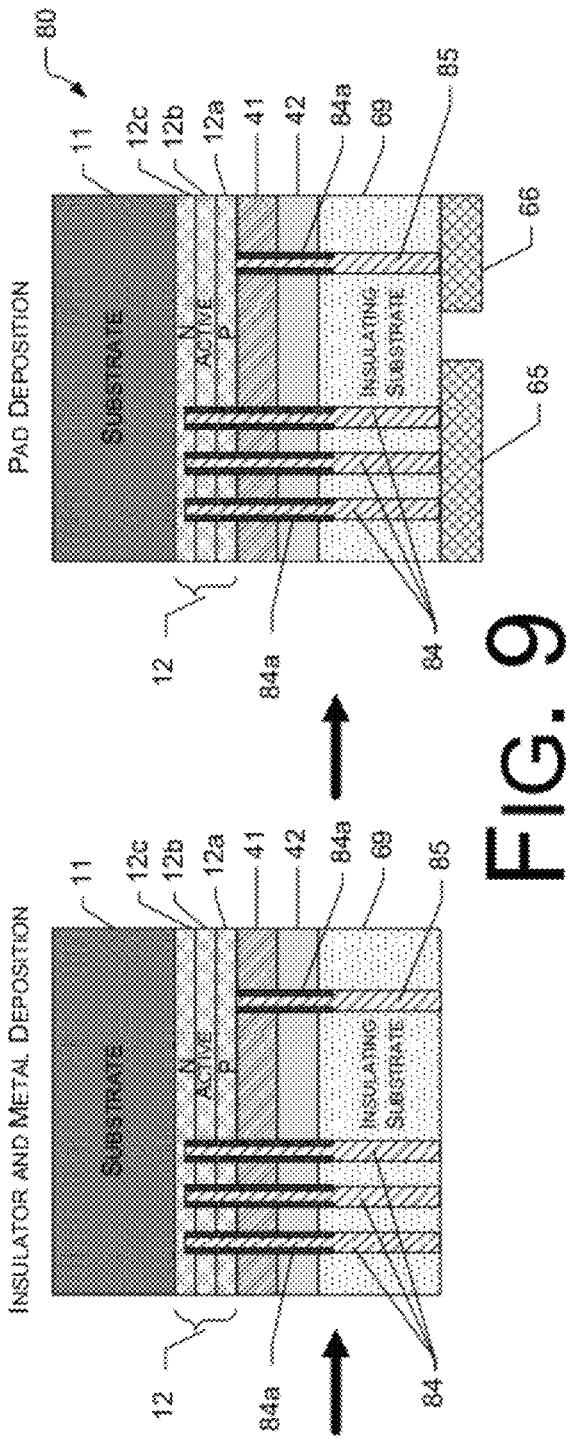
FIG. 9

FLIP CHIP TYPE LIGHT EMITTING DIODE AND MANUFACTURING METHOD THEREOF

CROSS-REFERENCE TO RELATED APPLICATIONS

This application claims the priority benefit of U.S. Patent Application No. 61/491,307, filed on May 30, 2011, and U.S. Patent Application No. 61/527,586, filed on Aug. 25, 2011. The entirety of the above-identified patent applications is hereby incorporated by reference and made a part of this specification.

BACKGROUND

1. Technical Field

The present disclosure relates to a light emitting diode and the manufacturing method thereof and, in particular, to a flip chip type light emitting diode and the manufacturing method thereof.

2. Description of Related Art

Conventional manufacturing method of light emitting diode (LED) packages typically places a plurality of gold balls on the electrodes of a substrate, and uses eutectic bonding to electrically couple flip chip type LED chips with corresponding electrodes of the substrate. Afterwards, an electrically insulating colloid (hereinafter referred to as "underfill") is supplied to fill the space between the LED chips and the substrate to enhance the reflectivity. Accordingly, with flip chip method, the issue of light blocking with horizontal type chip electrode that results in lower illumination efficiency may be avoided. However, misalignment may exist when bonding LED chips to the substrate by flip chip method, causing non-uniformity in the illumination. Moreover, coating the underfill between LED chips and substrate tends to result in higher manufacturing costs in addition to undesirable reflectivity.

A conventional flip chip type LED typically has an N-type semiconductor layer, a P-type semiconductor layer, and a light-emitting layer. A plurality of metallic conductive plugs traverse through the flip chip type LED from the P-type semiconductor layer through the light-emitting layer and to the N-type semiconductor layer. An N-type electrode at a bottom surface of the flip chip type LED is connected to a plurality of the metallic conductive plugs. A P-type electrode at the bottom surface of the flip chip type LED is connected to P-type semiconductor layer. Subsequently, by either eutectic bonding or reflow, the flip chip type LED is electrically coupled to electrodes on a substrate without using gold balls for the electrical coupling. This approach not only addresses the issue of misalignment when bonding LED chips to the substrate by flip chip method, but also avoids the need of the underfill. However, in electrically coupling the flip chip type LED and the substrate under this approach, due to the close proximity between the semiconductor layers (mesa or epi) and the substrate electrodes, reverse current and short circuit may result after eutectic bonding or reflow.

SUMMARY

To resolve the potential issues associated with packaging conventional LEDs, the present disclosure provides an LED chip that comprises a silicon substrate or an electrically insulating substrate. The LED chip comprises a transparent substrate and a semiconductor layer including an N-type semiconductor layer and a light-emitting layer and a P-type semiconductor layer that are sequentially formed on a surface of the transparent substrate. The LED chip further comprises a contact layer between the P-type semiconductor layer and a silicon substrate or an electrically insulating substrate. The LED chip comprises a plurality of first metallic conductive plugs that traverse from a bottom surface of the silicon substrate or electrically insulating substrate to the N-type semiconductor layer, a plurality of second metallic conductive plugs that traverse from the bottom surface of the silicon substrate or electrically insulating substrate to the P-type semiconductor layer, an N-type electrode disposed on the bottom surface of the silicon substrate or electrically insulating substrate and electrically coupled to the first metallic conductive plugs, and a P-type electrode disposed on the bottom surface of the silicon substrate and electrically coupled to the second metallic conductive plugs. The LED chip is electrically coupled to the silicon substrate by the flip chip type method. Accordingly, the silicon substrate or electrically insulating substrate can elevate the LED flip-chip structure to avoid the phenomenon of reverse current and short circuiting. Additionally, the silicon substrate or electrically insulating substrate may be a Zener diode to avoid breakdown of the LED flip-chip structure due to high electric current.

In the above-described embodiments of the present disclosure, a plurality of metallic conductive plugs are formed in the silicon substrate or electrically insulating substrate by the damascene process. Then, the silicon substrate or electrically insulating substrate is bonded to the semiconductor layer of the LED chip by eutectic bonding.

In the above-described embodiments of the present disclosure, the silicon substrate or electrically insulating substrate is bonded to the semiconductor layer of the LED chip. Through photolithography and metal deposition, a plurality of first metallic conductive plugs and a plurality of second metallic conductive plugs are formed in the LED chip. An insulating layer is formed around the side of the metallic conductive plugs to avoid short circuit due to electrical connection.

In the above-described embodiments of the present disclosure, the transparent substrate of the LED chip further comprises a patterned structure that is disposed in the semiconductor layer on the other side of the transparent substrate. The patterned structure may comprise a regular pattern or an irregular pattern that enhances illumination.

In the above-described embodiments of the present disclosure, the P-type electrode and the N-type electrode of the LED chip may be electrically coupled to electrodes on a substrate by eutectic bonding or reflow.

In the above-described embodiments of the present disclosure, an optical conversion material may be disposed above the LED flip-chip structure. The optical conversion material may be stimulated by the LED flip-chip structure and produce white light upon light mixing.

In one aspect, a flip chip type LED may comprise a substrate and an LED chip. The substrate may comprise: a body having a first surface and a second surface opposite to the first surface; a plurality of third pads disposed on the first surface; a fourth pad disposed on the first surface; a first electrode disposed on the second surface; a second electrode disposed on the second surface; a plurality of first vias traversing through the body, the first vias electrically coupling the third pads and the first electrode; and a second via traversing through the body, the second via electrically coupled to the fourth pad and the second electrode. The LED chip may be flip-chip bonded to the substrate, and may comprise: a transparent substrate; a first type semiconductor layer disposed on the transparent substrate; a second type semiconductor layer disposed on the first type semiconductor layer; an active semiconductor layer disposed between the first type semiconductor layer and the second type semiconductor layer; a first pad disposed on the first type semiconductor layer and electrically coupled to the third pads; and a second pad disposed on the second type semiconductor layer and electrically coupled to the fourth pad.

In another aspect, a flip chip type LED may comprise a substrate that comprises a body having a first surface and a second surface opposite to the first surface. The flip chip type LED may further comprise a first electrode disposed on the second surface; and a second electrode disposed on the second surface. The flip chip type LED may further comprise: a transparent substrate; a first type semiconductor layer disposed on the transparent substrate; a second type semiconductor layer disposed on the first type semiconductor layer; an active semiconductor layer disposed between the first type semiconductor layer and the second type semiconductor layer; an adhesive layer disposed between the second type semiconductor layer and the first surface of the substrate; a plurality of first vias traversing through the body of the substrate, the adhesive layer, the second type semiconductor layer, and the active semiconductor layer; and a second via traversing through the body of the substrate. The first vias may be electrically coupled to the first type semiconductor layer and the first electrode. The second via may be electrically coupled to the second type semiconductor layer and the second electrode.

In one aspect, a method of manufacturing a flip chip type LED may provide a substrate that comprises a body having a first surface and a second surface opposite to the first surface; a plurality of third pads disposed on the first surface; a fourth pad disposed on the first surface; a first electrode disposed on the second surface; a second electrode disposed on the second surface; a plurality of first vias traversing through the body, each of the first vias electrically coupled to a respective one of the third pads and the first electrode; and a second via traversing through the body, the second via electrically coupled to the fourth pad and the second electrode. The method may also provide an LED chip that comprises a transparent substrate; a first type semiconductor layer disposed on the transparent substrate; a second type semiconductor layer disposed on the first type semiconductor layer; an active semiconductor layer disposed between the first type semiconductor layer and the second type semiconductor layer; a first pad disposed on the first type semiconductor layer; and a second pad disposed on the second type semiconductor layer. The method may further comprise bonding the substrate and the LED chip such that the first pad and the second pad are electrically coupled to the third pads and the fourth pad, respectively.

In another aspect, a method of manufacturing a flip chip type LED may comprise: providing a transparent substrate; forming a first type semiconductor layer on the transparent substrate; forming an active semiconductor layer on the first type semiconductor substrate; forming a second type semiconductor layer on the active semiconductor substrate; forming an adhesive layer on the second type semiconductor substrate; forming a substrate that comprises a body having a first surface and a second surface opposite to the first surface; forming a plurality of first vias that traverse through the body of the substrate, the adhesive layer, the second type semiconductor layer, and the active semiconductor layer; forming a second via that traverses through the body of the substrate; forming a first electrode on the second surface of the body of the substrate, the first electrode electrically coupled to the first vias; and forming a second electrode on the second surface of the body of the substrate, the second electrode electrically coupled to the second via.

The substrate in various embodiments may be a silicon substrate or an electrically insulating substrate. In the case of silicon substrate, an electrical insulation layer needs to be provided on the walls of the vias and surfaces of the silicon substrate. This is not required in the case of electrically insulating substrate.

To aid better understanding of the advantages and merits of various embodiments of the present disclosure, a detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings.

FIGS. 8-9 illustrate the structure and manufacturing process of a flip chip type LED chip in accordance with a fourth embodiment of the present disclosure.

DETAILED DESCRIPTION OF PREFERRED EMBODIMENTS

First Embodiment

Figure 1:
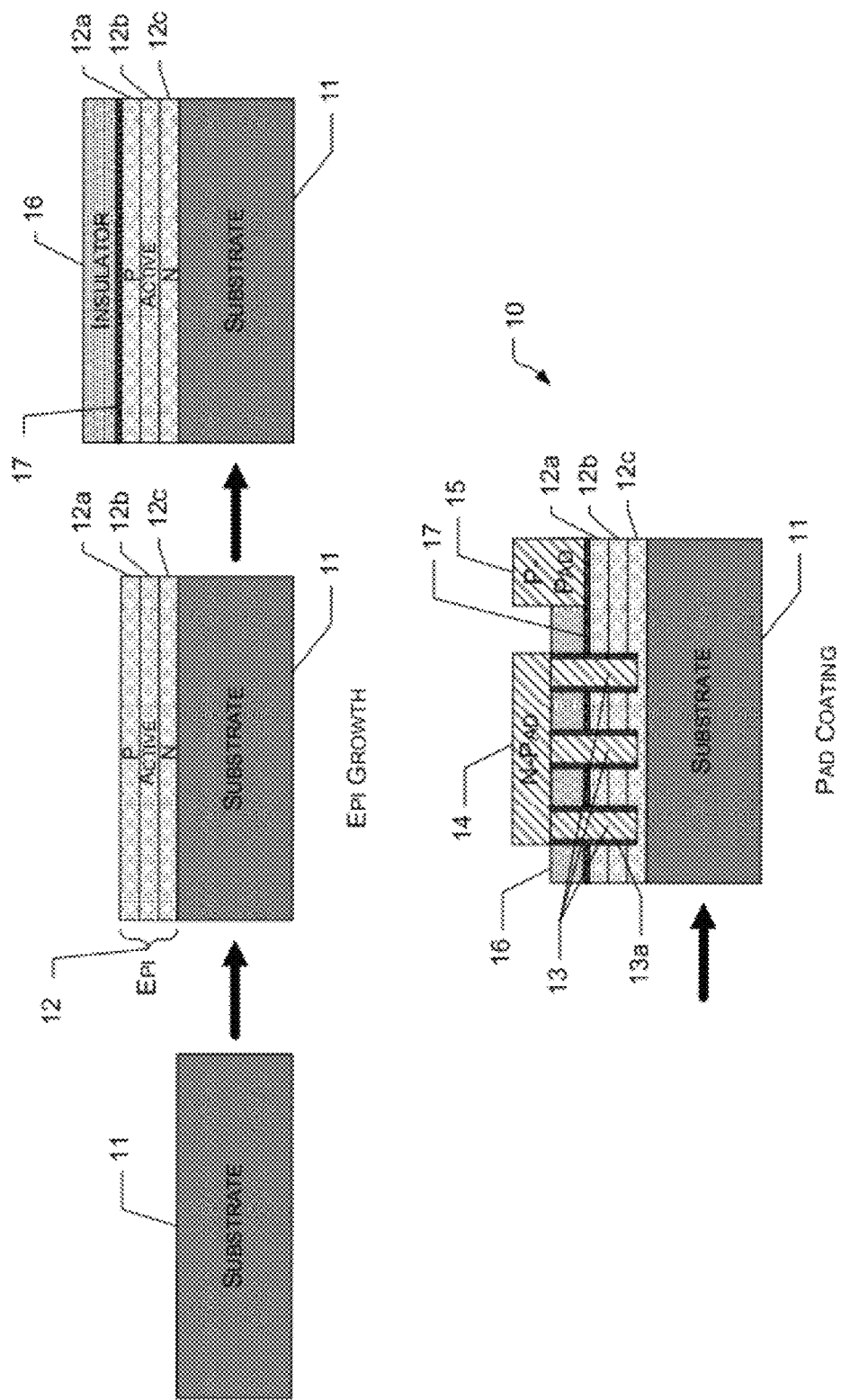
FIG. 1 illustrates the structure and manufacturing process of an LED chip in accordance with a first embodiment of the present disclosure.
Figure 2:
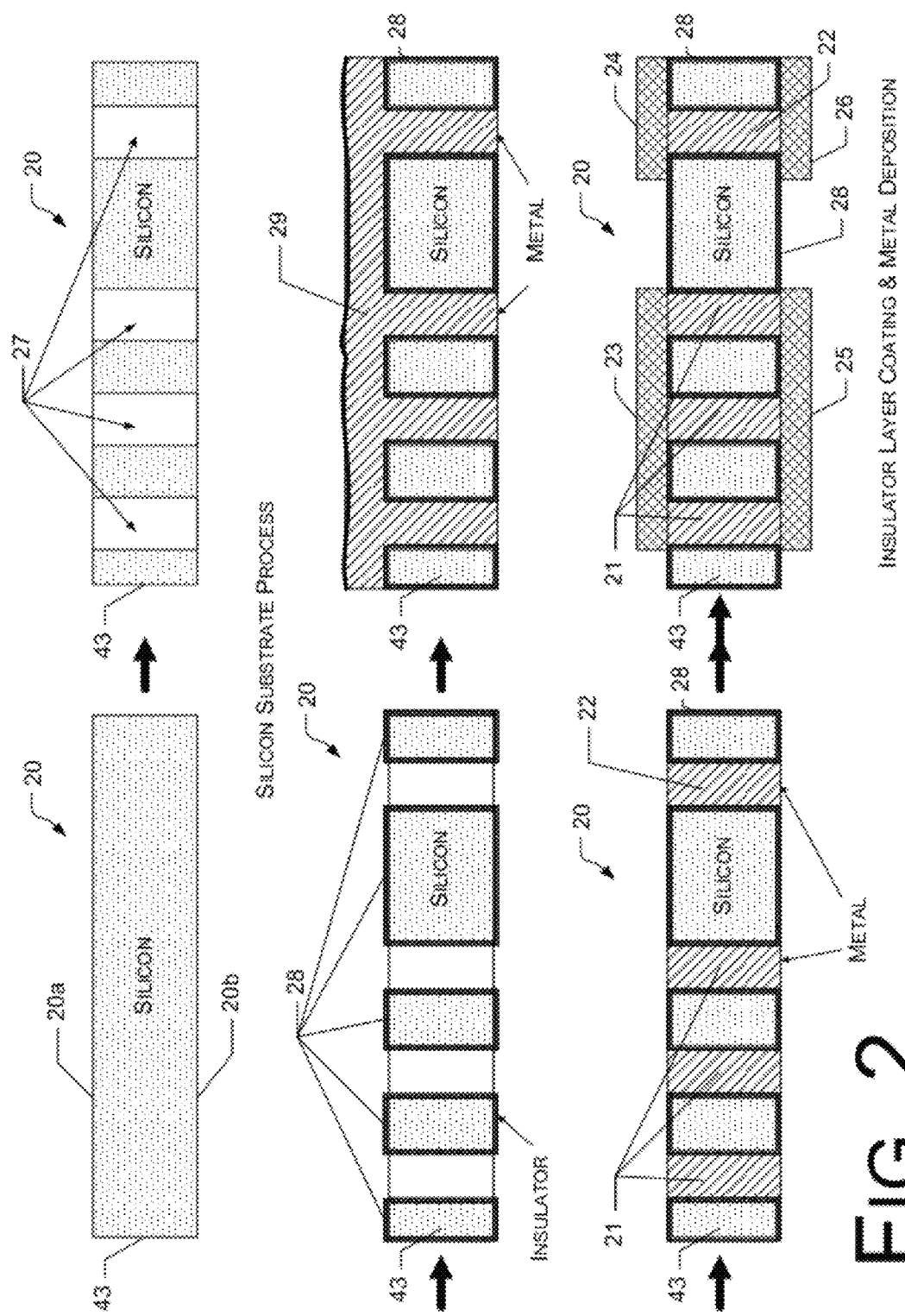
FIG. 2 illustrates the structure and manufacturing process of a silicon substrate in accordance with the first embodiment of the present disclosure.
Figure 3:
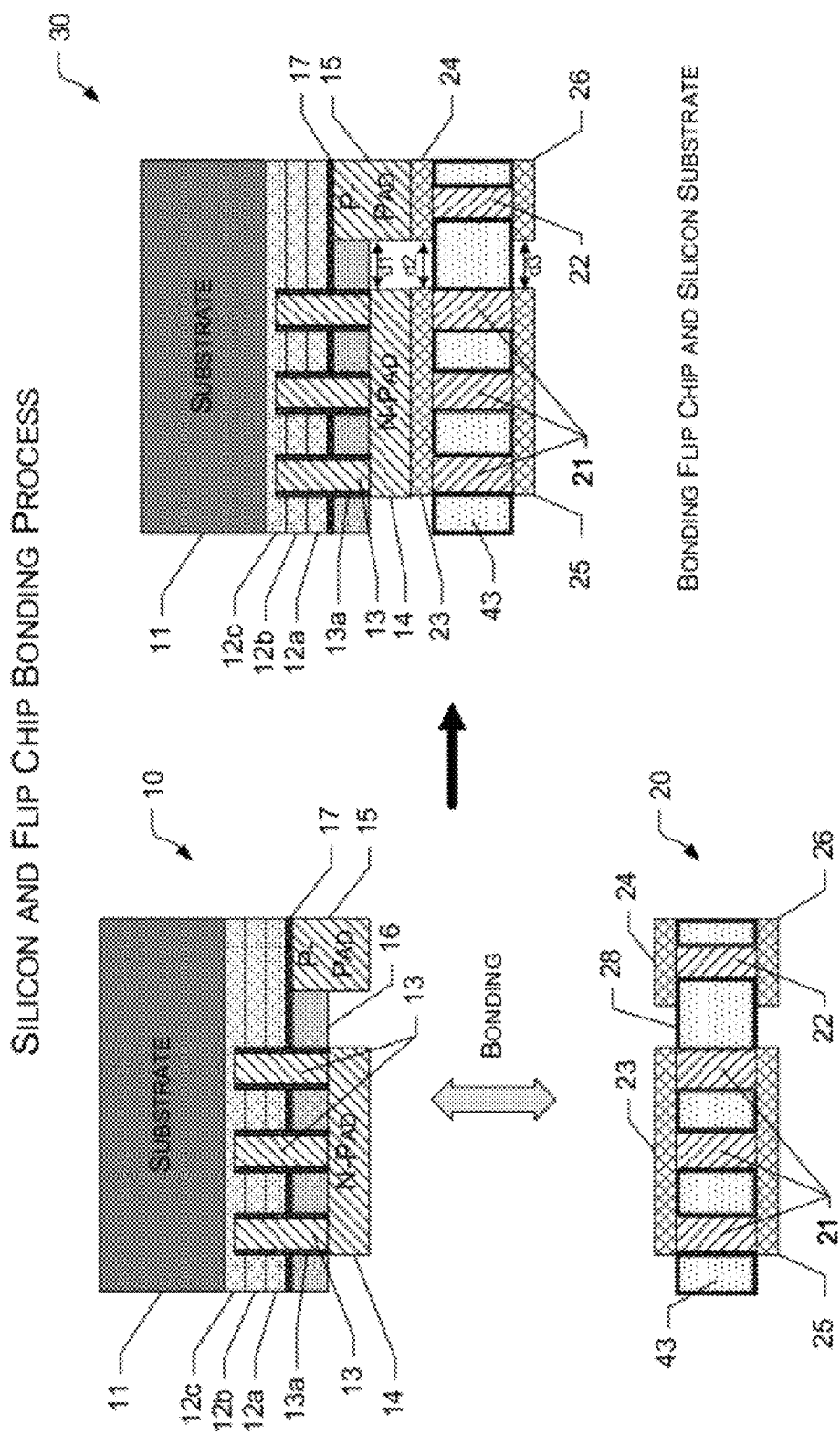
FIG. 3 illustrates the structure and manufacturing process of a flip chip type LED chip in accordance with the first embodiment of the present disclosure.

Referring to FIGS. 1-3, the present disclosure provides a flip chip type LED 30 which comprises a silicon substrate 20 and an LED chip 10. The silicon substrate 20 comprises a body 43, a plurality of third pads 23, a fourth pad 24, a first electrode 25, a second electrode 26, a plurality of first vias 21 and a second via 22. The body 43 of the silicon substrate 20 has a first surface 20a and a second surface 20b that is opposite to the first surface 20a. The third pads 23 are disposed on the first surface 20a. The fourth pad 24 is disposed on the first surface 20a. The first electrode 25 is disposed below the second surface 20b. The second electrode 26 is disposed below the second surface 20b. The first vias 21 traverse through the body 43 of the silicon substrate 20 and electrically couple at least one third pad 23 and the first electrode 25. The second via 22 traverses through the body 43 of the silicon substrate 20 and electrically couples the fourth pad 24 and the second electrode 26.

Additionally, the silicon substrate 20 comprises an electrical insulation layer 28 that is disposed between the first vias 21 and the body 43, between the second via 22 and the body 43, on a side surface of the body 43, and on areas of the first surface 20a and the second surface 20b that are not traversed by the first vias 21 and the second via 22.

The LED chip 10 is disposed on the silicon substrate 20 by flip chip method and comprises a transparent substrate 11, a first type semiconductor layer 12c, a second type semiconductor layer 12a, an active semiconductor layer 12b, at least one first pad 14, and at least one second pad 15. In one embodiment, the first type semiconductor layer 12c, the second type semiconductor layer 12a, and the active semiconductor layer 12b form an epi stack 12. In the epi stack 12, the first type semiconductor layer 12c is disposed on the transparent substrate 11, the second type semiconductor layer 12a is disposed on the first type semiconductor layer 12c, and the active semiconductor layer 12b is disposed between the first type semiconductor layer 12c and the second type semiconductor layer 12a. The first pad 14 is disposed on the second type semiconductor layer 12a of the epi stack 12, and is electrically coupled to the third pads 23. The second pad 15 is disposed on the second type semiconductor layer 12a of the epi stack 12, and is electrically coupled to the fourth pad 24.

In one embodiment, the LED chip 10 further comprises an electrical insulation layer 16 that is disposed on the second type semiconductor layer 12a of the epi stack 12 to isolate the first pad 14 and the second pad 15. In one embodiment, a uniform current distribution layer or a current spreading layer 17 may be disposed between the second pad 15 and the second type semiconductor layer 12a, and between the electrical insulation layer 16 and the second type semiconductor layer 12a. Such uniform current distribution layer or current spreading layer 17 may be, for example, a metallic electrically conductive layer or a transparent electrically conductive layer. Additionally, a peripheral side of the body 43 of the silicon substrate 20 is substantially perpendicular to the second surface 20b. In one embodiment, a distance d1 between the first pad 14 and the second pad 15, a distance d2 between the third pads 23 and the fourth pad 24, and a distance d3 between the first electrode 25 and the second electrode 26 are substantially the same. Alternatively, the distance d1 between the first pad 14 and the second pad 15 is greater than each of the distance d2 between the third pads 23 and the fourth pad 24 and the distance d3 between the first electrode 25 and the second electrode 26. In one embodiment, a peripheral side of the LED chip 10 is flush with, corresponding to or aligned to the peripheral side of the body 43 of the silicon substrate 20. The silicon substrate 20 improves the overall heat dissipation of the flip chip type LED 30.

In one embodiment, the first type semiconductor layer 12c is a P-type semiconductor layer and the second type semiconductor layer 12a is an N-type semiconductor layer. The first pad 14 and the second pad 15 are P-type contact layer and N-type contact layer, respectively. Alternatively, the first type semiconductor layer 12c is an N-type semiconductor layer and the second type semiconductor layer 12a is a P-type semiconductor layer. In such case the first pad 14 and the second pad 15 are N-type contact layer and P-type contact layer, respectively. The transparent substrate 11 may be sapphire. The flip chip type LED 30 may further comprise an adhesive layer disposed between the LED chip 10 and the silicon substrate 20. The adhesive layer may comprise at least an ohmic contact layer, a reflective layer, a bonding layer, a barrier layer, or any combination of one or more thereof. The transparent substrate 11 may comprise a regular profile roughened surface or, alternatively, an irregular profile roughened surface. The LED chip 10 may further comprise a plurality of third vias 13 that traverse through the second type semiconductor layer 12a and the active semiconductor layer 12b of the epi stack 12, and electrically couple the first pad 14 and the first type semiconductor layer 12c of the epi stack 12. The number of the third vias 13 may be equal to the number of the first vias 21, and in such case the effect of current spreading may be enhanced. Arrangement of the third pads 23, the first electrode 25 and the first pad 14 can vary depending on the application, and may include a combination of a single pad, multiple pads, a single electrode, multiple electrodes, a single contact layer or multiple contact layers. The number of pads, electrodes and contact layers may respectively be equal to the number of the third vias 13 or the number of the first vias 21. Moreover, the LED chip 10 may further comprise an electrical insulation layer 13a disposed between the third vias 13, the second type semiconductor layer 12a and the active semiconductor layer 12b to isolate the third vias 13, the second type semiconductor layer 12a and the active semiconductor layer 12b. Furthermore, a reflection layer may be disposed in the LED chip 10, near the first pad 14 or the second pad 15 for example, to reflect light generated by the active semiconductor layer 12b to cause the light to reach out of the LED chip 10 through the regular profile roughened surface or the irregular profile roughened surface of the transparent substrate 11, thereby enhancing the illumination effect of the LED chip 10.

Referring to FIGS. 1-3, the present disclosure additionally provides a manufacturing method of the flip chip type LED 30 which is described below. Firstly, a silicon substrate 20 is provided where the silicon substrate 20 comprises a body 43. The body 43 of the silicon substrate 20 comprises a first surface 20a and a second surface 20b that is opposite to the first surface 20a.

Then, a plurality of through holes 27 are formed to traverse through the body 43 of the silicon substrate 20. This may be accomplished by way of laser, mechanical means or etching to drill through the silicon substrate 20.

Afterwards, an electrical insulation layer 28 is formed on the body 43 of the silicon substrate 20 and the through holes 27. The electrical insulation layer 28 is disposed on the walls of the through holes 27 and on a side surface of the body 43 of the silicon substrate 20. Additionally, the electrical insulation layer 28 is disposed on areas of the first surface 20a and the second surface 20b that are not traversed by the through holes 27. This may be accomplished by way of deposition.

Next, a metal layer 29 is formed on the body 43 of the silicon substrate 20 and fills the through holes 27. This may be accomplished by way of electroplating or deposition.

Afterwards, the metal layer 29 is planarized to form a plurality of first vias 21 and a second via 22. This may be accomplished by way of chemical mechanical polishing (CMP) or etching.

Then, a plurality of third pads 23, a fourth pad 24, a first electrode 25 and a second electrode 26 are formed. The third pads 23 are electrically coupled to the first electrode 25 by the first vias 21. The fourth pad 24 is electrically coupled to the second electrode 26 through the second via 22. This may be accomplished by way of metal layer electroplating (or deposition) and planarization (using CMP or etching).

Thus, the processing of the silicon substrate 20 is complete. The silicon substrate 20 comprises a body 43, a plurality of third pads 23, a fourth pad 24, a first electrode 25, a second electrode 26, a plurality of first vias 21 and a second via 22. The body 43 of the silicon substrate 20 comprises a first surface 20a and a second surface 20b that is opposite to the first surface 20a. The third pads 23 and the fourth pad 24 are disposed on the first surface 20a. The first electrode 25 and the second electrode 26 are disposed on the second surface 20b. The first vias 21 traverse through the body 43 of the silicon substrate 20, and electrically coupled the third pads 23 and the first electrode 25. The second via traverses through the body 43 of the silicon substrate 20, and electrically couples the fourth pad 24 and the second electrode 26. Moreover, the silicon substrate 20 further comprises an electrical insulation layer 28. The electrical insulation layer 28 is disposed between the first vias 21 and the body 43, between the second via 22 and the body 43, and on a side surface of the body 43 such as areas of the first surface 20a and the second surface 20b that are not traversed by the through holes 27.

Next, an LED chip 10 is provided where the LED chip 10 comprises a transparent substrate 11, a first type semiconductor layer 12c, a second type semiconductor layer 12a, an active semiconductor layer 12b, a first pad 14, and a second pad 15. In one embodiment, the first type semiconductor layer 12c, the second type semiconductor layer 12a, and the active semiconductor layer 12b form an epi stack 12. In the epi stack 12, the first type semiconductor layer 12c is disposed on the transparent substrate 11, the second type semiconductor layer 12a is disposed on the first type semiconductor layer, and the active semiconductor layer 12b is disposed between the first type semiconductor layer 12c and the second type semiconductor layer 12a. The first pad 14 is disposed on the first type semiconductor layer 12c of the epi stack 12, and the second pad 15 is disposed on the second type semiconductor layer 12a of the epi stack 12.

Afterwards, the silicon substrate 20 and the LED chip 10 are bonded together. This results in the first pad 14 and the second pad 15 being electrically coupled to the third pads 23 and the fourth pad 24, respectively.

The LED chip 10 may further comprise an electrical insulation layer 16 that is disposed on the second type semiconductor layer 12a of the epi stack 12 to isolate the first pad 14 and the second pad 15.

In one embodiment, an alignment type flip-chip bonding between a large piece of silicon substrate and an LED wafer is carried out first to form a flip-chip bonding structure. In one embodiment, the large piece of silicon substrate comprises a plurality of silicon substrates 20, and the LED wafer comprises a plurality of LED chips 10. Subsequently, the flip-chip bonding structure is cut into a plurality of individual flip chip type LEDs 30.

In another embodiment, an alignment type flip-chip bonding between a large piece of silicon substrate and a plurality of LED chips 10 is performed first. In one embodiment, the large piece of silicon substrate comprises a plurality of silicon substrates 20. Then, the large piece of silicon substrate is cut to form a plurality of individual flip chip type LEDs 30.

In still another embodiment, an alignment type flip-chip bonding between a plurality of silicon substrate 20 and an LED wafer is carried out first. In one embodiment, the LED wafer comprises a plurality of LED chips 10. Next, the LED wafer is cut to form a plurality of individual flip chip type LEDs 30.

In a further embodiment, an alignment type flip-chip bonding between a silicon substrate 20 and an LED chip 10 is performed. Accordingly, a flip chip type LED 30 is formed without the cutting process.

In one embodiment, the first type semiconductor layer 12c is a P-type semiconductor layer and the second type semiconductor layer 12a is an N-type semiconductor layer, while the first pad 14 and the second pad 15 are respectively a P-type contact layer and an N-type contact layer. Alternatively, the first type semiconductor layer 12c is an N-type semiconductor layer and the second type semiconductor layer 12a is a P-type semiconductor layer, while the first pad 14 and the second pad 15 are respectively an N-type contact layer and a P-type contact layer. The transparent substrate 11 may be sapphire. In one embodiment, the bonding step may comprise forming an adhesive layer between the LED chip 10 and the silicon substrate 20. The adhesive layer may comprise at least an ohmic layer, a reflective layer, a bonding layer, a barrier layer, or any combination of one or more thereof. The transparent substrate 11 may comprise a regular profile roughened surface or, alternatively, an irregular profile roughened surface. The LED chip 10 may further comprise a plurality of third vias 13 that traverse through the second type semiconductor layer 12a and the active semiconductor layer 12b of the epi stack 12, and the first vias may electrically couple the first type semiconductor layer 12c of the epi stack 12 and the first pad 14. Additionally, the LED chip 10 may comprise an electrical insulation layer 13a. The electrical insulation layer 13a is disposed between the third vias 13, the second type semiconductor layer 12a and the active semiconductor layer 12b to isolate the third vias 13, the second type semiconductor layer 12a and the active semiconductor layer 12b. Moreover, a reflection layer may be disposed in the LED chip 10, near the first pad 14 or the second pad 15 for example, to reflect light generated by the active semiconductor layer 12b to cause the light to reach out of the LED chip 10 through the regular profile roughened surface or the irregular profile roughened surface of the transparent substrate 11, thereby enhancing the illumination effect of the LED chip 10.

Second Embodiment

Figure 4:
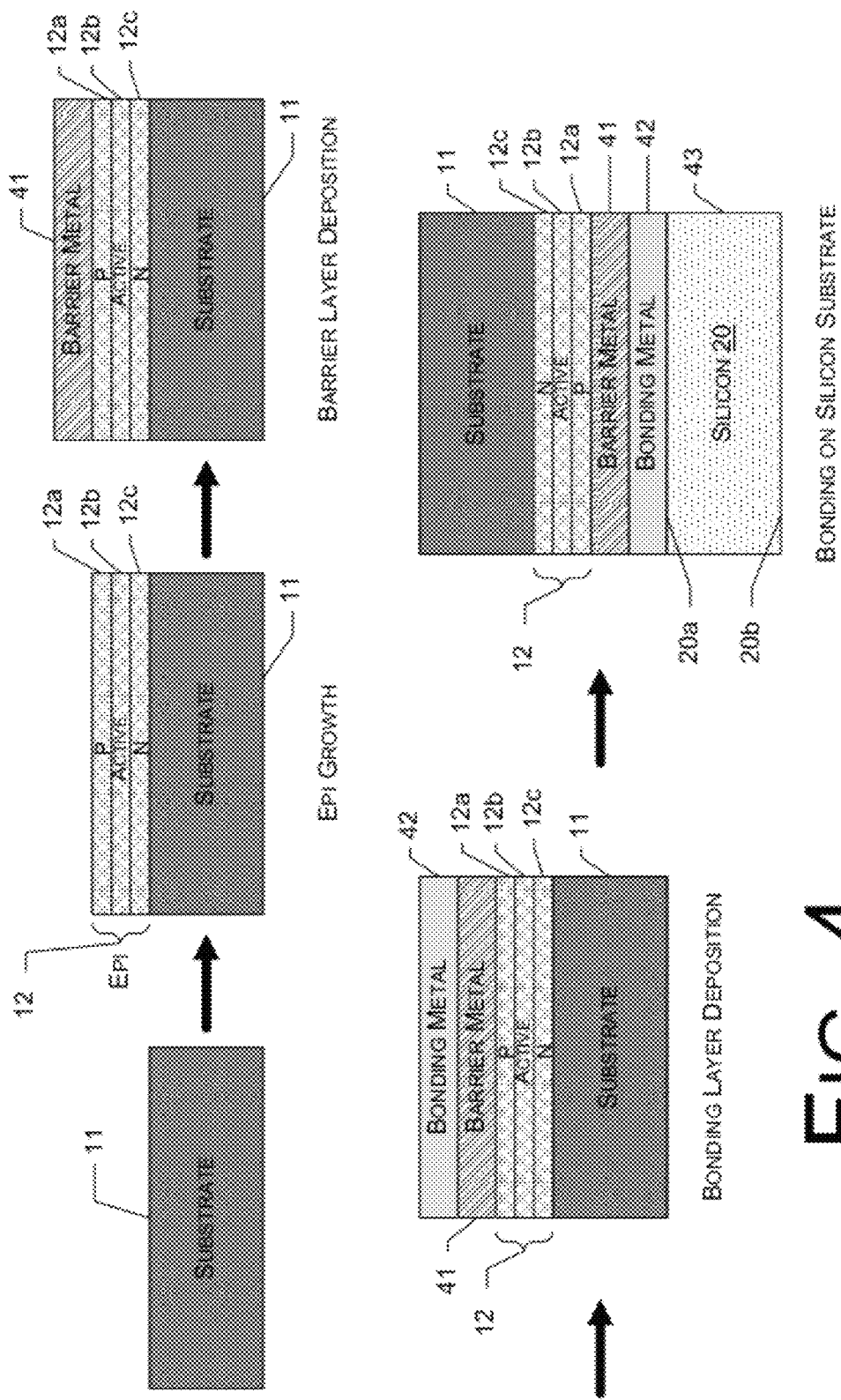
FIGS. 4-5 illustrate the structure and manufacturing process of a flip chip type LED chip in accordance with a second embodiment of the present disclosure.
Figure 5:
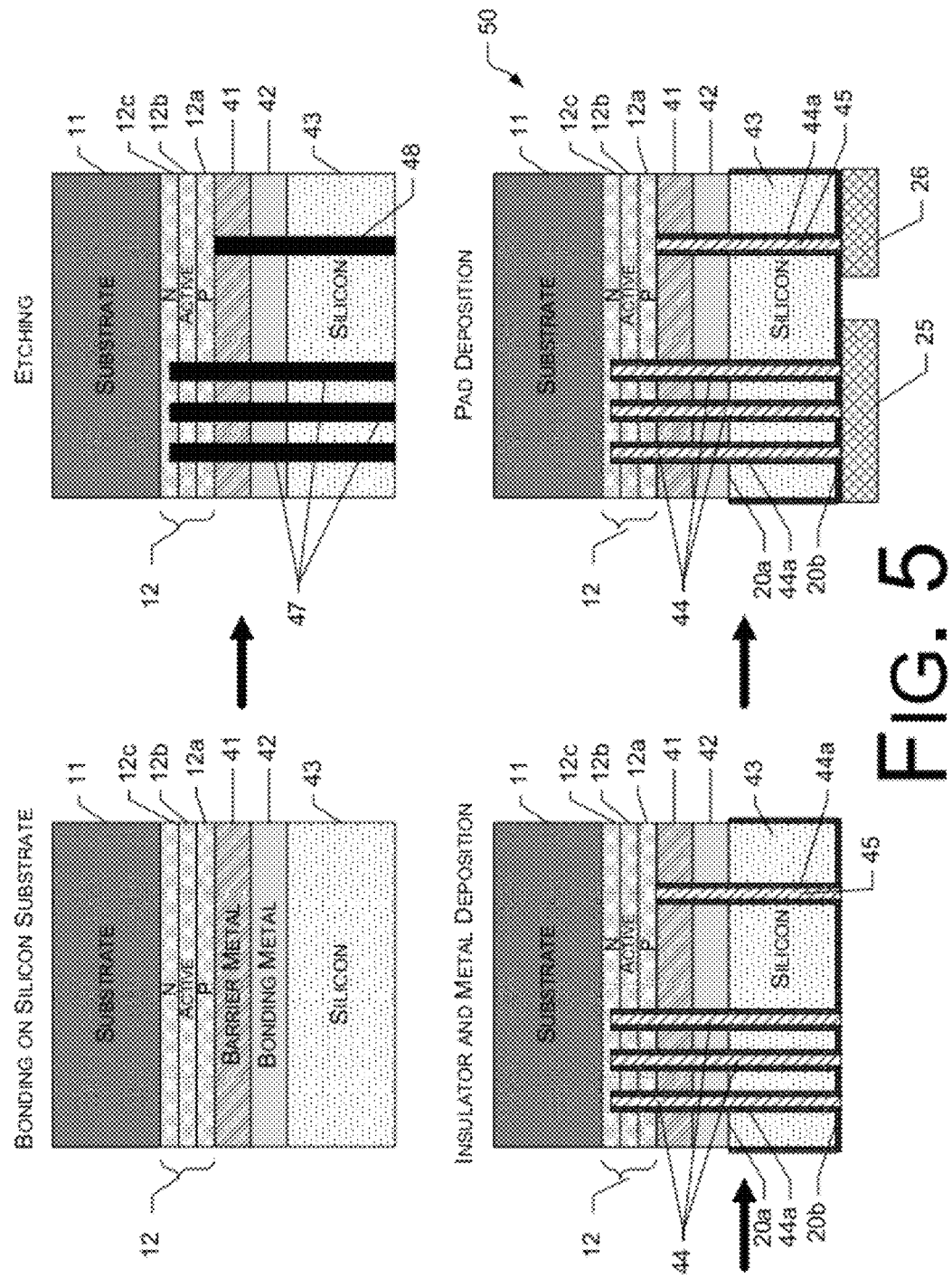

Referring to FIGS. 4-5, the present disclosure further provides a flip chip type LED 50 which comprises a silicon substrate 20, a transparent substrate 11, a first type semiconductor layer 12c, a second type semiconductor layer 12a, an active semiconductor layer 12b, an adhesive layer, a plurality of first vias 44, a second via 45, a first electrode 25, and a second electrode 26. The silicon substrate 20 comprises a body 43. The body 43 of the silicon substrate 20 comprises a first surface 20a and a second surface 20b that is opposite to the first surface 20b. The first electrode 25 and the second electrode 26 are disposed on the second surface 20b. In one embodiment, the first type semiconductor layer 12c, the second type semiconductor layer 12a, and the active semiconductor layer 12b form an epi stack 12. In the epi stack 12, the first type semiconductor layer 12c is disposed on the transparent substrate 11, the second type semiconductor layer 12a is disposed on the first type semiconductor layer 12c, and the active semiconductor layer 12b is disposed between the first type semiconductor layer 12c and the second type semiconductor layer 12a. The adhesive layer is disposed between the second type semiconductor layer 12a and the first surface 20a of the silicon substrate 20, and comprises a barrier layer 41 and a bonding layer 42. The barrier layer 41 is in contact with the second type semiconductor layer 12a of the epi stack 12, and the bonding layer 42 is in contact with the first surface 20a of the silicon substrate 20. The first vias 44 traverse through the body 43 of the silicon substrate 20, the adhesive layer (e.g., the barrier layer 41 and the bonding layer 42), and the second type semiconductor layer 12a and the active semiconductor layer 12b of the epi stack 12. The first vias 44 electrically couple the first type semiconductor layer 12c of the epi stack 12 and the first electrode 25. The second via 45 traverses through the body 43 of the silicon substrate 20, and electrically couples the second type semiconductor layer 12a of the epi stack 12 and the second electrode 26. In one embodiment, the second via 45 traverses through the body 43 of the silicon substrate 20 and the adhesive layer (e.g., the barrier layer 41 and the bonding layer 42). Additionally, a peripheral side of the body 43 of the silicon substrate 20 is substantially perpendicular to the second surface 20b. The silicon substrate 20 improves the overall heat dissipation of the flip chip type LED 50.

In one embodiment, the first type semiconductor layer 12c is a P-type semiconductor layer, and the second type semiconductor layer 12a is an N-type semiconductor layer. Alternatively, the first type semiconductor layer 12c is an N-type semiconductor layer, and the second type semiconductor layer 12a is a P-type semiconductor layer. The transparent substrate 11 may be sapphire. The adhesive layer may comprise at least an ohmic contact layer, a reflective layer, a bonding layer, a barrier layer, or any combination of one or more thereof. The transparent substrate 11 may comprise a regular profile roughened surface or, alternatively, an irregular profile roughened surface. The first electrode 25 may comprise a single electrode or multiple electrodes, and the number of the first electrodes may be equal to the number of the first vias 44.

In one embodiment, the flip chip type LED 50 may further comprise an electrical insulation layer 44a. The electrical insulation layer 44a may be disposed between the first vias 44 and the body 43 of the silicon substrate 20, between the first vias 44 and the adhesive layer (e.g., the barrier layer 41 and the bonding layer 42), between the first vias 44 and the second type semiconductor layer 12a and the active semiconductor layer 12b of the epi stack 12, between the second via 45 and the body 43 of the silicon substrate 20, and on a side surface of the body 43 of the silicon substrate 20. Additionally, the electrical insulation layer 44a may be disposed on areas of the second surface 20b that are not traversed by the first vias 44 and the second via 45. Moreover, an electrical insulation layer may be disposed between the bonding layer 42 and the body 43 of the silicon substrate 20. Furthermore, a reflection layer may be disposed in the flip chip type LED 50, near the first electrode 25 or the second electrode 26 for example, to reflect light generated by the active semiconductor layer 12b to cause the light to reach out of the flip chip type LED 50 through the regular profile roughened surface or the irregular profile roughened surface of the transparent substrate 11, thereby enhancing the illumination effect of the flip chip type LED 50.

Referring to FIGS. 4-5, the present disclosure further provides a manufacturing method of the flip chip type LED 50 which is described below.

First, a transparent substrate 11 is provided.

Next, a first type semiconductor layer 12c is formed on the transparent substrate 11.

Then, an active semiconductor layer 12b is formed on the first type semiconductor layer 12c.

Subsequently, a second type semiconductor layer 12a is formed on the active semiconductor layer 12b. In one embodiment, the first type semiconductor layer 12c, the second type semiconductor layer 12a, and the active semiconductor layer 12b form an epi stack 12.

Afterwards, an adhesive layer is formed on the second type semiconductor layer 12a of the epi stack 12.

Next, a silicon substrate 20 is formed on the adhesive layer. The silicon substrate 20 comprises a body 43 which comprises a first surface 20a and a second surface 20b that is opposite to the first surface 20a. The first surface 20a is in contact with the adhesive layer. The adhesive layer comprises a barrier layer 41 and a bonding layer 42. The barrier layer 41 is in contact with the second type semiconductor layer 12a of the epi stack 12, and the bonding layer 42 is in contact with the first surface 20a of the silicon substrate 20.

Then, a plurality of first through holes 47 and a second through hole 48 are formed. The first through holes 47 traverse through the body 43 of the silicon substrate 20, the bonding layer 42, the barrier layer 41, the second type semiconductor layer 12a and the active semiconductor layer 12b. The second through hole 48 traverses through the body 43 of the silicon substrate 20. This may be accomplished by way of laser, mechanical means or etching to drill through the silicon substrate 20.

Next, an electrical insulation layer 44a is formed on the body 43 of the silicon substrate 20, the first through holes 47 and the second through hole 48. In particular, the electrical insulation layer 44a is disposed on the walls of the first through holes 47 and the second through hole 48. The electrical insulation layer 44a is also disposed on a side surface of the body 43 of the silicon substrate 20, such as areas of the second surface 20b that are not traversed by the first through holes 47 and the second through hole 48.

Then, a plurality of first vias 44 are formed such that the first vias 44 traverse through the body 43 of the silicon substrate 20, the adhesive layer (e.g., the barrier layer 41 and the bonding layer 42), and the second type semiconductor layer 12a and the active semiconductor layer 12b of the epi stack 12. This may be accomplished by way of metal layer electroplating (or deposition) and planarization (using CMP or etching).

Subsequently, a second via 45 is formed such that the second via 45 traverses through the body 43 of the silicon substrate 20 and the adhesive layer (e.g., the barrier layer 41 and the bonding layer 42).

Afterwards, a first electrode 25 is formed on the second surface 20b of the silicon substrate 20 such that the first electrode 25 is electrically coupled to the first vias 44.

Next, a second electrode 26 is formed on the second surface 20b of the silicon substrate 20 such that the second electrode 26 is electrically coupled to the second via 45.

In one embodiment, a semiconductor wafer processing is carried out first. Then, a cutting processing is performed to form a plurality of individual flip chip type LEDs 50.

In one embodiment, the first type semiconductor layer 12c is a P-type semiconductor layer, and the second type semiconductor layer 12a is an N-type semiconductor layer. Alternatively, the first type semiconductor layer 12c is an N-type semiconductor layer, and the second type semiconductor layer 12a is a P-type semiconductor layer. The transparent substrate 11 may be sapphire. The adhesive layer may comprise at least an ohmic layer, a reflective layer, a bonding layer, a barrier layer, or any combination of one or more thereof. The transparent substrate 11 may comprise a regular profile roughened surface or, alternatively, an irregular profile roughened surface. Moreover, the electrical insulation layer 44a is disposed between the first vias 44 and the body 43 of the silicon substrate 20, between the first vias 44 and the adhesive layer (e.g., the barrier layer 41 and the bonding layer 42), between the first vias 44 and the second type semiconductor layer 12a and the active semiconductor layer 12b of the epi stack 12, and between the second via 45 and the body 43 of the silicon substrate 20. The electrical insulation layer 44a is disposed on a side surface of the body 43 of the silicon substrate 20, such as areas of the second surface 20b that are not traversed by the first vias 44 and the second via 45. Furthermore, an electrical insulation layer may be disposed between the bonding layer 42 and the body 43 of the silicon substrate 20. Additionally, a reflection layer may be disposed in the flip chip type LED 50, near the first electrode 25 or the second electrode 26 for example, to reflect light generated by the active semiconductor layer 12b to cause the light to reach out of the flip chip type LED 50 through the regular profile roughened surface or the irregular profile roughened surface of the transparent substrate 11, thereby enhancing the illumination effect of the flip chip type LED 50.

Third Embodiment

Figure 6:
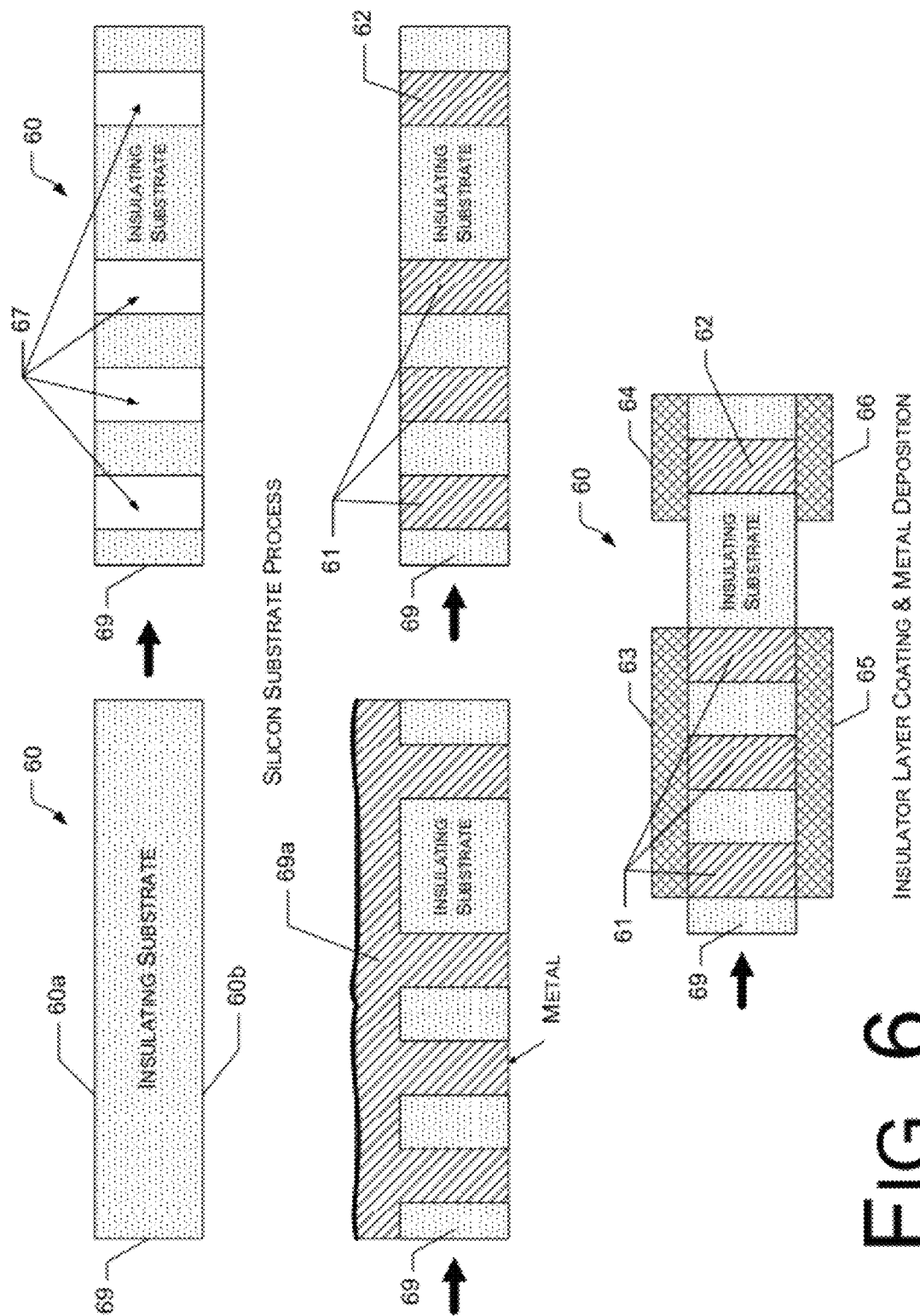
FIG. 6 illustrates the structure and manufacturing process of a silicon substrate in accordance with a third embodiment of the present disclosure.
Figure 7:
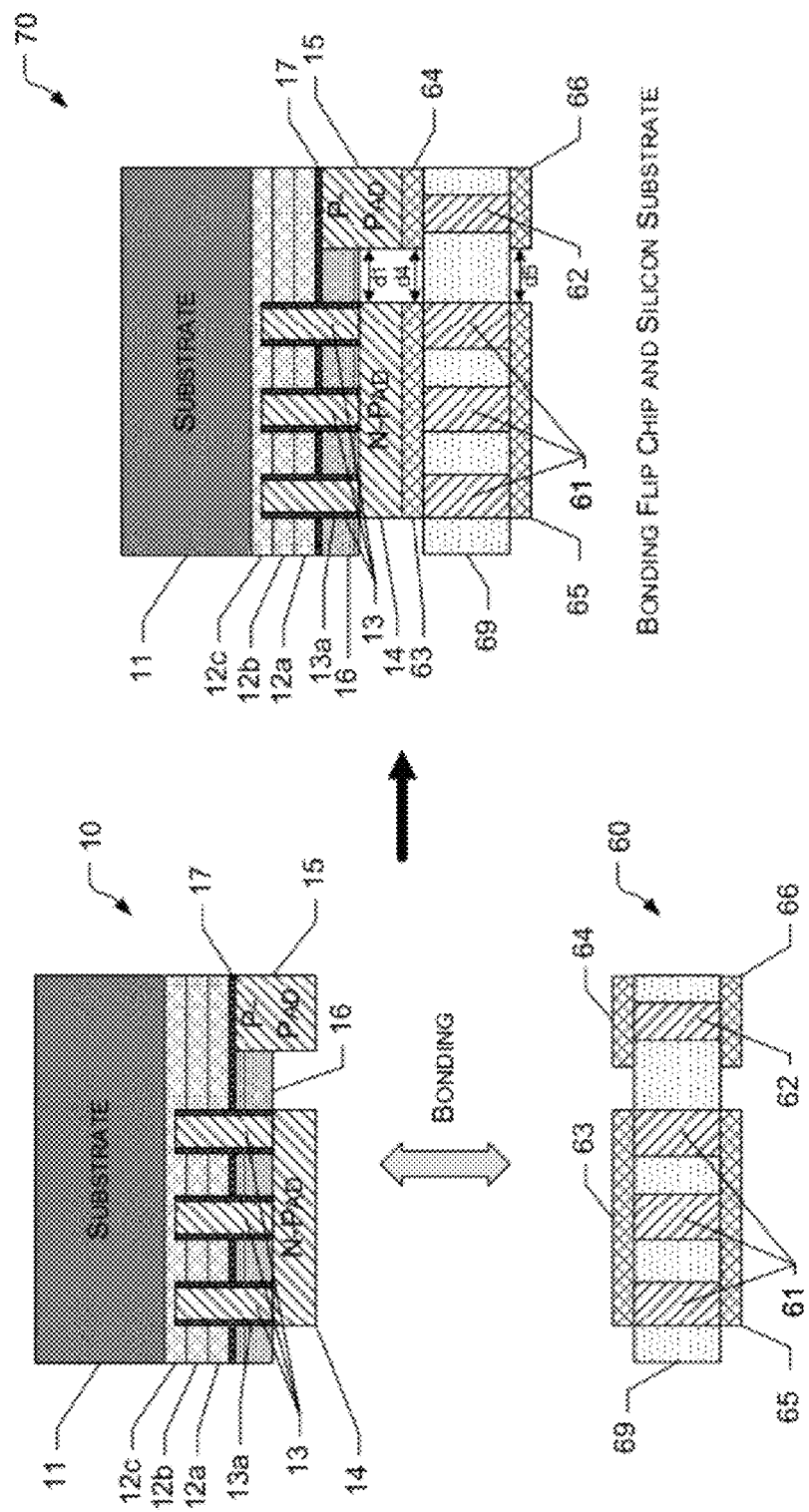
FIG. 7 illustrates the structure and manufacturing process of a flip chip type LED chip in accordance with the third embodiment of the present disclosure.

Referring to FIGS. 1 and 6-7, the present disclosure further provides a flip chip type LED 70 which comprises a silicon substrate or electrically insulating substrate 60 and an LED chip 10. In the interest of brevity, detailed description of the LED chip 10 will not be repeated. The electrically insulating substrate 60 comprises a body 69, a plurality of first pads 63, a second pad 64, a first electrode 65, a second electrode 66, a plurality of first vias 61, and a second via 62. The body 69 of the electrically insulating substrate 60 comprises a first surface 60a and a second surface 60b that is opposite to the first surface 60a. The first pads 63 and the second pad 64 are disposed on the first surface 60a. The first electrode 65 and the second electrode 66 are disposed on the second surface 60b. The first vias 61 traverse through the body 69 of the electrically insulating substrate 60, and electrically couple the first pads 63 and the first electrode 65. The second via 62 traverses through the body 69 of the electrically insulating substrate 60, and electrically couples the second pad 64 and the second electrode 66. In one embodiment, a peripheral side of the body 69 of the electrically insulating substrate 60 is substantially perpendicular to the second surface 60b. In one embodiment, a distance d1 between the first pad 14 and the second pad 15, a distance d4 between the first pads 63 and the second pad 64, and a distance d5 between the first electrode 65 and the second electrode 66 are substantially the same. Alternatively, the distance d1 between the first pad 14 and the second pad 15 is greater than each of the distance d4 between the first pads 63 and the second pad 64 and the distance d5 between the first electrode 65 and the second electrode 66. In one embodiment, a peripheral side of the LED chip 10 is flush with, corresponding to or aligned to the peripheral side of the body 43 of the electrically insulating substrate 60.

The electrically insulating substrate 60 may be a substrate that is electrically non-conductive but thermally conductive. The flip chip type LED 70 may further comprise an adhesive layer that is disposed between the LED chip 10 and the electrically insulating substrate 60. The adhesive layer may comprise an ohmic contact layer, a reflective layer, a bonding layer, and a barrier layer, or any combination of one or more thereof. The number of the third vias 13 may be equal to the number of the first vias 61. Arrangement of the first pads 63, the first electrode 65 and the first pad 14 can vary depending on the application, and may include a combination of a single pad, multiple pads, a single electrode, multiple electrodes, a single contact layer or multiple contact layers. The number of pads, electrodes and contact layers may respectively be equal to the number of the third vias 13 or the number of the first vias 61. The electrically insulating substrate 60 improves the overall heat dissipation of the flip chip type LED 70.

Referring to FIGS. 1 and 6-7, the present disclosure further provides a manufacturing method of the flip chip type LED 70 which is described below.

First, an electrically insulating substrate 60 is provided. The electrically insulating substrate 60 comprises a body 69 which comprises a first surface 60a and a second surface 60b opposite to the first surface 60a.

Next, a plurality of through holes 67 that traverse through the body 69 of the electrically insulating substrate 60 are formed. This may be accomplished by way of laser, mechanical means or etching to drill through the electrically insulating substrate 60.

Then, a metal layer 69a is formed on the body 69 of the electrically insulating substrate 60 and fills the through holes 67. This may be accomplished by way of electroplating or deposition.

Afterwards, the metal layer 69a is planarized to form a plurality of first vias 61 and a second via 62. This may be accomplished by way of CMP or etching.

Next, a first pad 63, a second pad 64, a first electrode 65, and a second electrode 66 are formed. The first vias 61 electrically couple the first pads 63 and the first electrode 65. The second via 62 electrically couples the second pad 64 and the second electrode 66. This may be accomplished by way of metal electroplating (or deposition) and planarization (using CMP or etching).

The manufacturing process of the electrically insulating substrate 60 described above provides the electrically insulating substrate 60. The electrically insulating substrate 60 comprises a body 69, a plurality of first pads 63, a second pad 64, a first electrode 65, a second electrode 66, a plurality of first vias 61, and a second via 62. The body 69 comprises a first surface 60a and a second surface 60b opposite to the first surface 60a, with the first pads 63 and the second pad 64 disposed on the first surface 60a and with the first electrode 65 and the second electrode 66 disposed on the second surface 60b. The first vias traverse through the body 69 of the electrically insulating substrate 60, and electrically couple the first pads 63 and the first electrode 65. The second via 62 traverses through the body 69 of the electrically insulating substrate 60, and electrically couples the second pad 64 and the second electrode 66.

The LED chip 10 is then provided. The LED chip 10 comprises a transparent substrate 11, a first type semiconductor layer 12c, a second type semiconductor layer 12a, an active semiconductor layer 12b, a first pad 14, and a second pad 15. In one embodiment, the first type semiconductor layer 12c, the second type semiconductor layer 12a, and the active semiconductor layer 12b form an epi stack 12. In the epi stack 12, the first type semiconductor layer 12c is disposed on the transparent substrate 11, the second type semiconductor layer 12a is disposed on the first type semiconductor layer 12c with the active semiconductor layer 12b disposed between the first type semiconductor layer 12c and the second type semiconductor layer 12a. The first pad 14 is disposed on the first type semiconductor layer 12c of the epi stack 12. The second pad 15 is disposed on the second type semiconductor layer 12a of the epi stack 12.

Subsequently, the electrically insulating substrate 60 and the LED chip 10 are bonded together with the first pad 14 and the second pad 15 electrically coupled to the first pads 63 and the second pad 64, respectively.

In one embodiment, an alignment type flip-chip bonding between a large piece of electrically insulating substrate and an LED wafer is carried out first to form a flip-chip bonding structure. In one embodiment, the large piece of electrically insulating substrate comprises a plurality of electrically insulating substrates 60, and the LED wafer comprises a plurality of LED chips 10. Subsequently, the flip-chip bonding structure is cut into a plurality of individual flip chip type LEDs 70.

In another embodiment, an alignment type flip-chip bonding between a large piece of electrically insulating substrate and a plurality of LED chips 10 is performed first. In one embodiment, the large piece of electrically insulating substrate comprises a plurality of electrically insulating substrates 60. Then, the large piece of electrically insulating substrate is cut to form a plurality of individual flip chip type LEDs 70.

In still another embodiment, an alignment type flip-chip bonding between a plurality of electrically insulating substrate 60 and an LED wafer is carried out first. In one embodiment, the LED wafer comprises a plurality of LED chips 10. Next, the LED wafer is cut to form a plurality of individual flip chip type LEDs 30.

In a further embodiment, an alignment type flip-chip bonding between an electrically insulating substrate 60 and an LED chip 10 is performed. Accordingly, a flip chip type LED 70 is formed without the cutting process.

Fourth Embodiment

Figure 8:
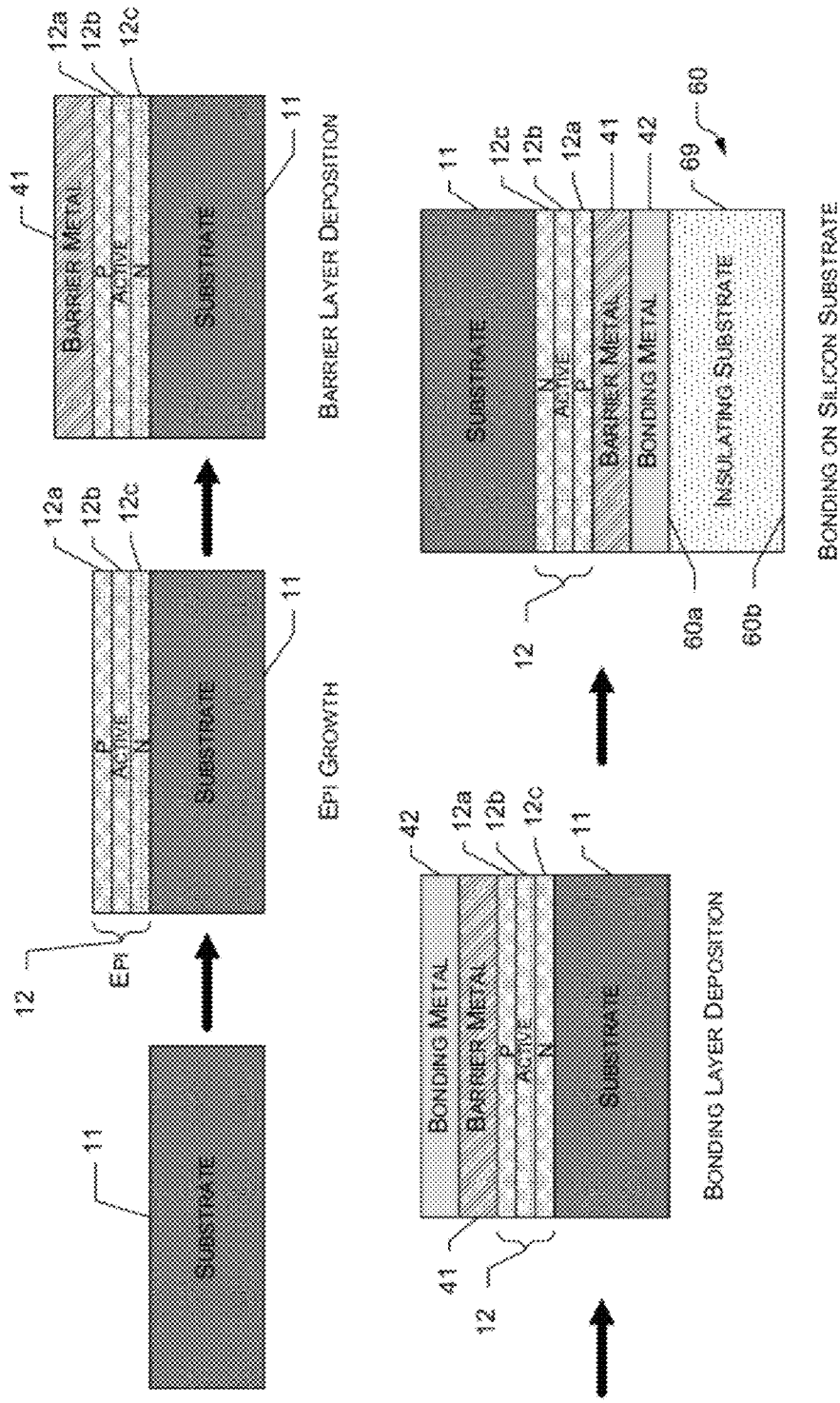

Referring to FIGS. 8-9, the present disclosure further provides a flip chip type LED 80 which comprises an electrically insulating substrate 60, a transparent substrate 11, a first type semiconductor layer 12c, a second type semiconductor layer 12a, an active semiconductor layer 12b, an adhesive layer, a plurality of first vias 84, a second via 85, a first electrode 65, and a second electrode 66. The electrically insulating substrate 60 comprises a body 69. The body 69 of the electrically insulating substrate 60 comprises a first surface 60a and a second surface 60b that is opposite to the first surface 60a. The first electrode 65 and the second electrode 66 are disposed on the second surface 60b. In one embodiment, the first type semiconductor layer 12c, the second type semiconductor layer 12a, and the active semiconductor layer 12b form an epi stack 12. In the epi stack 12, the first type semiconductor layer 12c is disposed on the transparent substrate 11, the second type semiconductor layer 12a is disposed on the first type semiconductor layer 12c, and the active semiconductor layer 12b is disposed between the first type semiconductor layer 12c and the second type semiconductor layer 12a. The adhesive layer is disposed between the second type semiconductor layer 12a and the first surface 60a of the silicon substrate 20, and comprises a barrier layer 41 and a bonding layer 42. The barrier layer 41 is in contact with the second type semiconductor layer 12a of the epi stack 12, and the bonding layer 42 is in contact with the first surface 60a of the electrically insulating substrate 60. The first vias 84 traverse through the body 69 of the electrically insulating substrate 60, the adhesive layer (e.g., the barrier layer 41 and the bonding layer 42), and the second type semiconductor layer 12a and the active semiconductor layer 12b of the epi stack 12. The first vias 44 electrically couple the first type semiconductor layer 12c of the epi stack 12 and the first electrode 65. The second via 85 traverses through the body 69 of the electrically insulating substrate 60, and electrically couples the second type semiconductor layer 12a of the epi stack 12 and the second electrode 66. In one embodiment, the second via 85 traverses through the body 69 of the electrically insulating substrate 60 and the adhesive layer (e.g., the barrier layer 41 and the bonding layer 42). Additionally, a peripheral side of the body 69 of the electrically insulating substrate 60 is substantially perpendicular to the second surface 60b. The electrically insulating substrate 60 improves the overall heat dissipation of the flip chip type LED 80.

The flip chip type LED 80 may further comprise an electrical insulation layer 84a. The electrical insulation layer 84a may be disposed between the first vias 84 and a portion of the body 69 bordering the adhesive layer (e.g., the barrier layer 41 and the bonding layer 42), between the first vias 84 and the adhesive layer, and between the first vias 84 and the second type semiconductor layer 12a and the active semiconductor layer 12b of the epi stack 12. The electrical insulation layer 84a may also be disposed between the second via 85 and a portion of the body 69 bordering the adhesive layer (e.g., the barrier layer 41 and the bonding layer 42), and between the second via 85 and the adhesive layer.

In one embodiment, the first type semiconductor layer 12c is a P-type semiconductor layer, and the second type semiconductor layer 12a is an N-type semiconductor layer. Alternatively, the first type semiconductor layer 12c is an N-type semiconductor layer, and the second type semiconductor layer 12a is a P-type semiconductor layer. The transparent substrate 11 may be sapphire. The adhesive layer may comprise at least an ohmic layer, a reflective layer, a bonding layer, a barrier layer, or any combination of one or more thereof. The first electrode 65 may comprise a single electrode or multiple electrodes. The number of the first electrodes may be equal to the number of the first vias 84. The transparent substrate 11 may comprise a regular profile roughened surface or, alternatively, an irregular profile roughened surface. Additionally, a reflection layer may be disposed in the LED chip 80, near the first electrode 65 or the second electrode 66 for example, to reflect light generated by the active semiconductor layer 12b to cause the light to reach out of the LED chip 80 through the regular profile roughened surface or the irregular profile roughened surface of the transparent substrate 11, thereby enhancing the illumination effect of the LED chip 80.

Referring to FIGS. 8-9, the present disclosure further provides a manufacturing method of the flip chip type LED 70 which is described below.

First, a transparent substrate 11 is provided.

Next, a first type semiconductor layer 12c is formed on the transparent substrate 11.

Then, an active semiconductor layer 12b is formed on the first type semiconductor layer 12c.

Afterwards, a second type semiconductor layer 12a is formed on the active semiconductor layer 12b. The first type semiconductor layer 12c, the second type semiconductor layer 12a and the active semiconductor layer 12b form an epi stack 12.

Then, an adhesive layer is formed on the second type semiconductor layer 12a of the epi stack 12.

Next, an electrically insulating substrate 60 is bonded to the adhesive layer. The electrically insulating substrate 60 comprises a body 69 which comprises a first surface 60a and a second surface 60b that is opposite to the first surface 60a. The first surface 60a is in contact with the adhesive layer. The adhesive layer may comprise a barrier layer 41 and a bonding layer 42. The barrier layer 41 is in contact with the second type semiconductor layer 12a of the epi stack 12, and the bonding layer 42 is in contact with the first surface 60a of the electrically insulating substrate 60.

Then, a plurality of first through holes 87 and a second through hole 88 are formed. The first through holes 87 traverse through the body 69 of the electrically insulating substrate 60, the bonding layer 42, the barrier layer 41, the second type semiconductor layer 12a and the active semiconductor layer 12b. The second through hole 88 traverses through the body 69 of the electrically insulating substrate 60. This may be accomplished by way of laser, mechanical means or etching to drill through the electrically insulating substrate 60.

Next, an electrical insulation layer 84a is formed partially in the first through holes 87 and the second through hole 88. The electrical insulation layer 84a is disposed in the walls of the first through holes 87 and the second through hole 88. The electrical insulation layer 84a covers the walls of the first through holes 87 that are in the epi stack 12 and the adhesive layer, and further covers at least a portion of the walls of the first through holes 87 and the second through hole 88 in the adhesive layer and a portion of the body 69 that borders the adhesive layer. This may be accomplished by way of deposition.

Afterwards, a plurality of first vias 84 are formed. The first vias 84 traverse through the body 69 of the electrically insulating substrate 60, the adhesive layer (e.g., the barrier layer 41 and the bonding layer 42), and the second type semiconductor layer 12a and the active semiconductor layer 12b of the epi stack 12. This may be accomplished by way of metal electroplating (or deposition) and planarization (using CMP or etching).

Then, a second via 85 is formed. The second via 85 traverses through the body 69 of the electrically insulating substrate 60. In one embodiment, the second via 85 traverses through the body 69 of the electrically insulating substrate 60 and the adhesive layer (e.g., the barrier layer 41 and the bonding layer 42).

Next, a first electrode 65 is formed on the second surface 60b of the electrically insulating substrate 60. The first electrode 65 is electrically coupled to the first vias 84.

Then, a second electrode 66 is formed on the second surface 60b of the electrically insulating substrate 60. The second electrode 66 is electrically coupled to the second via 85.

In one embodiment, a semiconductor wafer processing is carried out first. Then, a cutting processing is performed to form a plurality of individual flip chip type LEDs 80.

In one embodiment, the first type semiconductor layer 12c is a P-type semiconductor layer, and the second type semiconductor layer 12a is an N-type semiconductor layer. Alternatively, the first type semiconductor layer 12c is an N-type semiconductor layer, and the second type semiconductor layer 12a is a P-type semiconductor layer. The transparent substrate 11 may be sapphire. The adhesive layer may comprise at least an ohmic layer, a reflective layer, a bonding layer, a barrier layer, or any combination of one or more thereof. The transparent substrate 11 may comprise a regular profile roughened surface or, alternatively, an irregular profile roughened surface. The electrical insulation layer 84a may be disposed between the first vias 84 and a portion of the body 69 bordering the adhesive layer, between the first vias 84 and the adhesive layer (e.g., the barrier layer 41 and the bonding layer 42), and between the first vias 84 and the second type semiconductor layer 12a and the active semiconductor layer 12b of the epi stack 12. Moreover, an electrical insulation layer may be disposed between the bonding layer 42 and the electrically insulating substrate 60. Additionally, a reflection layer may be disposed in the LED chip 80, near the first electrode 65 or the second electrode 66 for example, to reflect light generated by the active semiconductor layer 12b to cause the light to reach out of the LED chip 80 through the regular profile roughened surface or the irregular profile roughened surface of the transparent substrate 11, thereby enhancing the illumination effect of the LED chip 80.

Conclusion

To resolve the potential issues associated with packaging conventional LEDs, the present disclosure provides an LED chip that comprises a silicon substrate or an electrically insulating substrate. The LED chip comprises a transparent substrate and a semiconductor layer including an N-type semiconductor layer, a light-emitting layer and a P-type semiconductor layer that are sequentially formed on a surface of the transparent substrate. The LED chip further comprises a contact layer and a silicon substrate or an electrically insulating substrate. The contact layer is disposed between the P-type semiconductor layer and the silicon substrate or electrically insulating substrate. The LED chip comprises a plurality of first metallic conductive plugs that traverse from a bottom surface of the silicon substrate or electrically insulating substrate to the N-type semiconductor layer, a plurality of second metallic conductive plugs that traverse from the bottom surface of the silicon substrate or electrically insulating substrate to the P-type semiconductor layer, an N-type electrode disposed on the bottom surface of the silicon substrate or electrically insulating substrate and electrically coupled to the first metallic conductive plugs, and a P-type electrode disposed on the bottom surface of the silicon substrate or electrically insulating substrate and electrically coupled to the second metallic conductive plugs. The LED chip is electrically coupled to a substrate by the flip chip type method. Accordingly, the silicon substrate or electrically insulating substrate can elevate the LED flip-chip structure to avoid the phenomenon of short circuiting. Additionally, the silicon substrate or electrically insulating substrate may be a Zener diode to avoid breakdown of the LED flip-chip structure due to high electric current.

In the above-described embodiments of the present disclosure, a plurality of metallic conductive plugs are formed in the silicon substrate or electrically insulating substrate by photoresist etching or the damascene process. Then, the silicon substrate or electrically insulating substrate is bonded to the semiconductor layer of the LED chip by eutectic bonding.

In the above-described embodiments of the present disclosure, the silicon substrate or electrically insulating substrate is bonded to the semiconductor layer of the LED chip. Through photolithography and metal deposition, a plurality of first metallic conductive plugs and a plurality of second metallic conductive plugs are formed in the LED chip. An electrically insulating layer is formed around the side of the metallic conductive plugs to avoid short circuit due to electrical connection.

In the above-described embodiments of the present disclosure, the transparent substrate of the LED chip further comprises a patterned structure that is disposed in the semiconductor layer on the other side of the transparent substrate. The patterned structure may comprise a regular pattern or an irregular pattern that enhances illumination.

In the above-described embodiments of the present disclosure, the P-type electrode and the N-type electrode of the LED chip may be electrically coupled to electrodes on a substrate by eutectic bonding or reflow.

In the above-described embodiments of the present disclosure, an optical conversion material may be disposed above the LED flip-chip structure. The optical conversion material may be stimulated by the LED flip-chip structure and produce white light upon light mixing.

The above-described substrate may be a silicon substrate or an electrically insulating substrate. In the case of silicon substrate, an electrical insulation layer needs to be provided on the walls of the vias and surfaces of the silicon substrate. This is not required in the case of electrically insulating substrate.

While the present disclosure has been described by way of example and in terms of the preferred embodiments, it is to be understood that the present disclosure is not limited to the disclosed embodiments. To the contrary, the present disclosure is intended to cover various modifications and similar arrangements (as would be apparent to those skilled in the art). Therefore, the scope of the appended claims shall be accorded the broadest interpretation so as to encompass all such modifications and similar arrangements.

What is claimed is:

1. A light emitting diode (LED), comprising:
   a substrate that comprises:

a body having a first surface and a second surface opposite to the first surface;
a plurality of third pads disposed on the first surface;
a fourth pad disposed on the first surface;
a first electrode disposed on the second surface;
a second electrode disposed on the second surface;
a plurality of first vias traversing through the body and electrically coupling the third pads and the first electrode;
a second via traversing through the body and electrically coupling the fourth pad and the second electrode; and
a plurality of third vias; and
an LED chip that is flip-chip bonded to the substrate, the LED chip comprising:
a transparent substrate;
a first type semiconductor layer disposed on the transparent substrate;
an active semiconductor layer disposed on the first type semiconductor layer;
a second type semiconductor layer disposed on the active semiconductor layer;
a first pad disposed on the second type semiconductor layer and electrically coupled to the third pads; and
a second pad disposed on the second type semiconductor layer and electrically coupled to the fourth pad;
wherein the plurality of third vias traverse through the second type semiconductor layer and the active semiconductor layer, and wherein the plurality of third vias electrically couple the first pad and the first type semiconductor layer, and
wherein a peripheral side of the LED chip is flush with a peripheral side of the body of the substrate.

2. The LED as recited in claim 1, wherein the substrate comprises a silicon substrate or an electrically insulating substrate.

3. The LED as recited in claim 1, wherein the first type semiconductor layer and the second type semiconductor layer comprise a combination of an N-type semiconductor layer and a P-type semiconductor layer.

4. The LED as recited in claim 1, wherein the transparent substrate comprises sapphire.

5. The LED as recited in claim 1, further comprising:
an adhesive layer disposed between the LED chip and the substrate.

6. The LED as recited in claim 5, wherein the adhesive layer comprises an ohmic contact layer, a reflective layer, a bonding layer, a barrier layer, or any combination of one or more thereof.

7. The LED as recited in claim 1, wherein the transparent substrate comprises a regular profile roughened surface or an irregular profile roughened surface.

8. The LED as recited in claim 1, wherein a number of the third vias is equal to a number of the first vias.

9. The LED as recited in claim 1, wherein a distance between the first pad and the second pad is greater than either or, or equal to both of, a distance between the third pads and the fourth pad and a distance between the first electrode and the second electrode.

10. The LED as recited in claim 1, wherein an arrangement of the third pads, the first electrode and the first pad includes a combination of a single pad, multiple pads, a single electrode, multiple electrodes, a single contact layer or multiple contact layers.

11. The LED as recited in claim 1, further comprising:
an electrical insulation layer disposed between the third vias, the second type semiconductor layer and the active semiconductor layer to isolate the third vias, the second type semiconductor layer and the active semiconductor layer.

12. The LED as recited in claim 1, further comprising:
an electrical insulation layer disposed between the first vias and the body, between the second via and the body, on a side surface of the body, and on areas of the first surface of the body and the second surface of the body that are not traversed by the first vias and the second via.

13. The LED as recited in claim 1, further comprising:
a current distribution layer disposed between the second pad and the second type semiconductor layer, and between the electrical insulation layer and the second type semiconductor layer.

14. A light emitting diode (LED), comprising:
a substrate that comprises a body having a first surface and a second surface opposite to the first surface;
a transparent substrate;
a first type semiconductor layer disposed on the transparent substrate;
an active semiconductor layer disposed on the first type semiconductor layer;
a second type semiconductor layer disposed on the active semiconductor layer;
a plurality of first vias traversing through the body of the substrate, the second type semiconductor layer, and the active semiconductor layer;
a second via traversing through the body of the substrate;
a first electrode disposed on the second surface of the body;
a second electrode disposed on the second surface of the body;
an adhesive layer disposed between the second type semiconductor layer and the first surface of the substrate; and
an electrical insulation layer disposed between the first vias and the body of the substrate, between the first vias and the adhesive layer, between the first vias and the second type semiconductor layer and the active semiconductor layer, between the second via and the body of the substrate, and on a side surface of the body of the substrate,
wherein the first vias electrically couple the first type semiconductor layer and the first electrode, and wherein the second via electrically couple the second type semiconductor layer and the second electrode.

15. The LED as recited in claim 14, wherein the substrate comprises a silicon substrate or an electrically insulating substrate.

16. The LED as recited in claim 14, wherein the first type semiconductor layer and the second type semiconductor layer comprise a combination of an N-type semiconductor layer and a P-type semiconductor layer.

17. The LED as recited in claim 14, wherein the transparent substrate comprises sapphire.

18. The LED as recited in claim 14, wherein the adhesive layer comprises an ohmic contact layer, a reflective layer, a bonding layer, a barrier layer, or any combination of one or more thereof.

19. The LED as recited in claim 14, wherein the transparent substrate comprises a regular profile roughened surface or an irregular profile roughened surface.

* * * * *